United States Patent [19]
Chen et al.

[11] Patent Number: 6,166,536
[45] Date of Patent: Dec. 26, 2000

[54] SYSTEM AND METHOD FOR MEASURING ERASE BAND WIDTHS ON MAGNETIC MEDIA

[75] Inventors: Jianping Chen, Milpitas; Hans Jürgen Richter, Santa Clara, both of Calif.

[73] Assignee: Seagate Technology LLC, Scotts Valley, Calif.

[21] Appl. No.: 09/122,495

[22] Filed: Jul. 24, 1998

Related U.S. Application Data

[60] Provisional application No. 60/069,427, Dec. 11, 1997.

[51] Int. Cl.[7] .................................................. G01R 33/12
[52] U.S. Cl. .......................... 324/212; 360/119; 360/125
[58] Field of Search .............................. 324/207.12, 210, 324/212, 225, 226; 360/119, 125, 126, 75, 77.02, 31, 72.1; 369/55, 56, 58

[56] References Cited

U.S. PATENT DOCUMENTS

| | | | |
|---|---|---|---|
| 4,644,421 | 2/1987 | Miwa et al. | 360/66 |
| 5,388,007 | 2/1995 | Sekimoto | 360/13 |
| 5,479,696 | 1/1996 | McNeil | 29/603 |
| 5,495,379 | 2/1996 | McNeil et al. . | |
| 5,691,862 | 11/1997 | Hashinmoto | 360/104 |
| 5,889,630 | 3/1999 | Karube et al. | 360/75 |
| 5,998,994 | 12/1999 | Mori | 324/212 |
| 6,006,614 | 12/1999 | Guzik et al. | 73/865.6 |

OTHER PUBLICATIONS

Tsann Lin, Jordie A. Christner, Terry B. Mitchell/ Jan. 1989/ IEEE vol. 25 No. 1.
Mingiyue Huang, Derek Yeo and Tuan Tran—"Effects of the Increase of Side Erase Band Width on Off–Track Capability of High Frequency Magnetic Recording",*IEEE Transactions on Magnetics*, vol. 32, No. 5, Sep. 1996, p. 3294–3296.
Tsann Lin, Jodie A. Christner, Terry B. Mitchell, Jing–Sheng Gau and Peter K. George—"Effects of Current and Frequency on Write, Read, and Erase Widths for Thin–Film Inductive and Magnetoresistive Heads", *IEEE Transactions on Magnetics*, vol. 25, No. 1, Jan. 1989—pp. 710–715.
J. K. Lee and P. I. Bonyhard, "A Track Density Model for Magnetoresistive Heads Considering Erase Bands, "*IEEE Transactions on Magnetics*, vol. 26, No. 5. Sep. 1990, pp. 2475–2477.

*Primary Examiner*—Christine K. Oda
*Assistant Examiner*—Subhash Zaveri
*Attorney, Agent, or Firm*—Merchant & Gould P.C.

[57] ABSTRACT

A method for measuring the width of an erase band located adjacent to a test track containing a periodic signal at a specified frequency is disclosed. For each position of a read head as it incrementally traverses the erase band and test track, an information signal is read, and a signal level data point is stored which represents the amplitude of the fundamental frequency obtained from a Fourier transform of the information signal. In addition, a media noise level data point is stored which represents an integration of a noise power spectrum obtained from the Fourier spectrum of the information signal over a predetermined frequency range. Once the signal and media noise level data points are obtained, the edge of the test track is approximated by determining from the signal level data points a point at which the amplitude of the stored signal level data points departs from an otherwise substantially constant background noise level. The edge of the erase band is also approximated by determining from the media noise level data points a point at which the amplitude of the stored media noise level data points departs from an otherwise substantially constant background noise level. The width of the erase band is derived by computing the absolute value of the difference between the positions of the edge of the test track and the edge of the erase band.

15 Claims, 5 Drawing Sheets

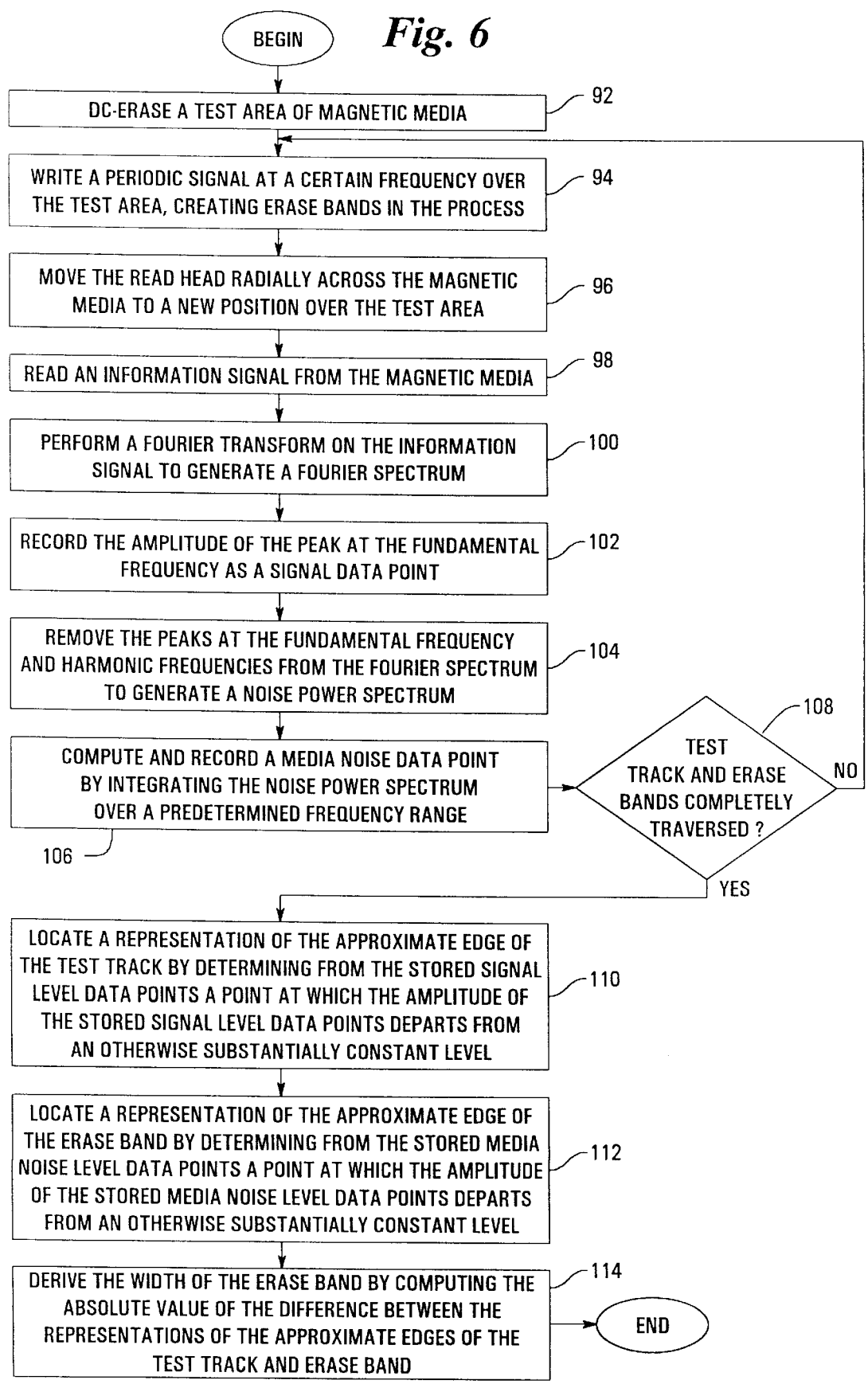

SYSTEM AND METHOD FOR MEASURING ERASE BAND WIDTHS ON MAGNETIC MEDIA

CROSS-REFERENCE TO RELATED APPLICATIONS

Embodiments of this invention relate to Provisional Application Ser. No. 60/069,427, filed Dec. 11, 1997. The contents of that application are incorporated by reference herein.

BACKGROUND OF THE INVENTION

1. Field of the Invention

Embodiments of this invention relate generally to erase bands on magnetic media of the type generally used for storing digital data, and in particular embodiments to methods for measuring the width of erase bands on magnetic media, and systems incorporating the same.

2. Description of Related Art

Disk drives typically contain at least one magnetic disk that rotates relative to one or more read/write head assemblies. There is typically one read/write head assembly for each disk surface. The read/write head assemblies magnetize areas on the disk during writing and sense the magnetization of areas on the disk during reading. Conventional read/write head assemblies include a coil wrapped about a C-shaped core, the ends of the core forming two magnetic poles separated by a gap. When writing information onto a disk, current flow in the coil causes magnetic flux to flow in the core and fringe across the gap. Part of the magnetic flux flows into a portion of the disk located under the gap and magnetizes that portion of the disk in a direction parallel to the magnetic flux lines. If the direction of current flow is subsequently reversed, the direction of magnetic flux is also reversed, and areas of the disk will be magnetized in the opposite direction.

When a conventional read/write head assembly is configured to read information from the disk, the magnetized portions of the disk passing under the gap induce a voltage across the coil. The polarity of the induced voltage is dependent on the orientation of the magnetized portion of the disk. As magnetized portions of the disk pass under the gap, the induced voltages are sensed and converted into data.

Information is stored within tracks on the disk, where each track has a width that is approximately equivalent to the width of the read/write head. Typically, such tracks define a pattern of concentric ring-shaped or spiral areas of disk recording surfaces. However, when writing data onto a particular track location, read/write heads will magnetize an area of the disk wider than the width of the head due to magnetic field effects at the edges of the read/write head (edge effects). Data on adjacent track portions may therefore be inadvertently corrupted due to these edge effects. Adjacent track portions can also generate noise and false data transitions when the read/write head is reading information from a particular track location. These effects may be intensified if the head is not properly aligned over the center of the track.

The writing and reading problems associated with adjacent track portions can be minimized if erase bands are formed between tracks. Erase bands are areas of randomized magnetic moments located on either side of a track, and are not intended to carry any recorded information. Erase bands are typically created simultaneously with writing data onto a disk. During writing, in addition to writing data onto the desired track, the read/write head erases any information on the sides of the track by causing the magnetic moments in the bands adjacent to the track to be randomized. No special or separate head is needed to create erase bands, as the randomized magnetic moments are a product of the edge effects of the read/write head.

During reading, the lack of a signal from the erase band will allow the read/write head to move off-center with respect to the center of the track to a certain degree without the read operation being corrupted by the data of adjacent track portions. The degree to which a read/write head can move off-center of the track and still read data accurately is known as off-track capability. The bit error rate (BER) of data read by the read/write head while off-track is known as off-track performance.

Erase bands can therefore be beneficial for off-track performance. However, it is not beneficial to make the width of erase bands arbitrarily large. Given the finite storage area available on magnetic media such as hard disks, increasing the erase band width (EBW) will decrease track density (the number of tracks per unit length) and the overall data storage capability of the disk. High track density can be maintained by narrowing the track widths, but as track width decreases, the output signal during readback will also be reduced. As the output signal is reduced, the signal-to-noise ratio (SNR) will decrease as noise from other sources such as the channel electronics and the head becomes larger with respect to the output signal, eventually reaching a point sufficient to corrupt the signal being read. Thus, the tradeoffs between track density, track width, off-track performance, and BER establish a practical upper limit to EBW.

Another factor affecting EBW is the linear density (the number of flux reversals per unit length) of the recorded disk. Data storage capability can be increased by writing more information (more flux reversals) in a given length of track, thereby increasing the linear density. As indicated in FIG. 5, as information is written with increased linear density, the EBW of the simultaneously created erase bands increases. Thus, maximizing data storage capability can be a complex process involving tradeoffs between the competing parameters of linear density, track density, EBW, track width, off-track performance, and BER. Measurement of EBW is therefore an important task in the research and development of magnetic media products.

Several methods are currently used in EBW measurement. One method utilizes magneto-force microscopy (MFM), wherein the magnetic force between a magnetized tip and the magnetic media is sensed and an "image" is formed to determine the boundaries and widths of erase bands and tracks. A disadvantage of MFM methods is that it takes a long time to obtain one measurement, making repeated measurements impractical.

A faster method is disclosed in the article "Effects of the Increase of Side Erase Band Width on Off-Track Capability of High Frequency Magnetic Recording" by Huang, Yeo, and Tran in IEEE Transactions on Magnetics, Vol. 32, No. 5, September 1996. In that method, the magnetic media is DC-erased, two reference tracks are written at the same linear density, and a desired track is written over the two background reference tracks, also at the same linear density. A track scan is then performed (moving a read head radially across a track) in which a narrow-band overwrite filter is used to measure the narrow band read back signal. The resultant signal profile as a function of the read head position is then computer-extrapolated, and after some calculations the EBW can be approximated.

Another method is disclosed in the article "Effects of Current and Frequency on Write, Read, and Erase Widths for Thin-Film Inductive and Magnetoresistive Heads" by Lin, Christner, Mitchell, Gau, and George in IEEE Transactions on Magnetics, Vol. 25, No. 1, January 1989. In that method, the magnetic media is DC-erased, two reference tracks are written at the same linear density, and a desired track is written over the two background reference tracks at a different linear density. A track scan is then performed with two spectrum analyzers independently tuned to the frequency of the reference and desired tracks, and the resultant read head output voltage profile of the three tracks is used to calculate an approximate EBW.

SUMMARY OF THE DISCLOSURE

Therefore, it is an object of embodiments of the invention to provide a system and method for measuring EBW by conducting a track scan of both the signal and media noise across the track and erase band.

It is a further object of preferred embodiments of the invention to provide a system and method for measuring EBW without a need to first write reference tracks.

It is a further object of preferred embodiments of the invention to provide a system and method for measuring EBW without a need to write a plurality of tracks at different linear densities.

It is a further object of preferred embodiments of the invention to provide a system and method for measuring EBW without a need to use a plurality of spectrum analyzers.

These and other objects are accomplished according to a method for measuring the width of an erase band located adjacent to a test track containing a periodic signal at a specified frequency. For each position of a read head as it incrementally traverses the erase band and test track, an information signal is read, and a signal level data point is stored which represents the amplitude of the fundamental frequency obtained from a Fourier transform of the information signal. In addition, a media noise level data point is stored which represents an integration of a noise power spectrum obtained from the Fourier spectrum of the information signal over a predetermined frequency range.

Once the signal and media noise level data points are obtained, the edge of the test track is approximated by determining from the signal level data points a point at which the amplitude of the stored signal level data points departs from an otherwise substantially constant background noise level. The edge of the erase band is also approximated by determining from the media noise level data points a point at which the amplitude of the stored media noise level data points departs from an otherwise substantially constant background noise level. The width of the erase band is derived by computing the absolute value of the difference between the positions of the edge of the test track and the edge of the erase band.

These and other objects, features, and advantages of embodiments of the invention will be apparent to those skilled in the art from the following detailed description of embodiments of the invention, when read with the drawings and appended claims.

BRIEF DESCRIPTION OF THE DRAWINGS

FIG. 6 is a flowchart of a process for measuring the width of an erase band according to an embodiment of the invention.

DETAILED DESCRIPTION OF PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention. For example, although the description and drawings reference a disk drive, it is understood that embodiments of the present invention may be used with magnetizable media other than disks (e.g. tapes and cylinders).

A disk drive stores information within a generally concentric ring or spiral-shaped track pattern on the disk. Each track contains a series of magnetizable areas whose orientation of magnetic moments may be changed. To maximize track density (the number of tracks per unit radial length) and overall data storage capability of a disk, tracks are placed concentrically and in close proximity to each other, or in embodiments utilizing spiral tracks, track portions spiral in close proximity to each other. However, the close proximity of adjacent track portions can cause problems during reading and writing. During writing, edge effects cause the read/write head to magnetize an area of the disk wider than the width of the head, and adjacent track portions may be inadvertently overwritten. Adjacent track portions can also generate noise and false data transitions when data from a selected track is being read back. These effects may be intensified if the read/write head is not well-aligned over the center of the track.

The writing and reading problems associated with adjacent track portions can be minimized if erase bands are formed between tracks. Erase bands are areas of randomized magnetic moments located on either side of a track, and are not intended to carry any recorded information. Erase bands are typically created simultaneously with writing data onto a disk. During writing, in addition to writing data onto the desired track, the read/write head assembly erases any information on the sides of the track by causing the magnetic moments in the bands adjacent to the track to be randomized. No special or separate head is needed to create erase bands, as the randomized magnetic moments are a product of the edge effects of the read/write head.

However, erase bands typically should not be made arbitrarily wide. Maximizing data storage capability is a complex process involving tradeoffs between the competing parameters of linear density, track density, EBW, track width, off-track performance, and BER. Measurement of EBW is therefore an important task in the research and development of magnetic media products.

Figure 1:
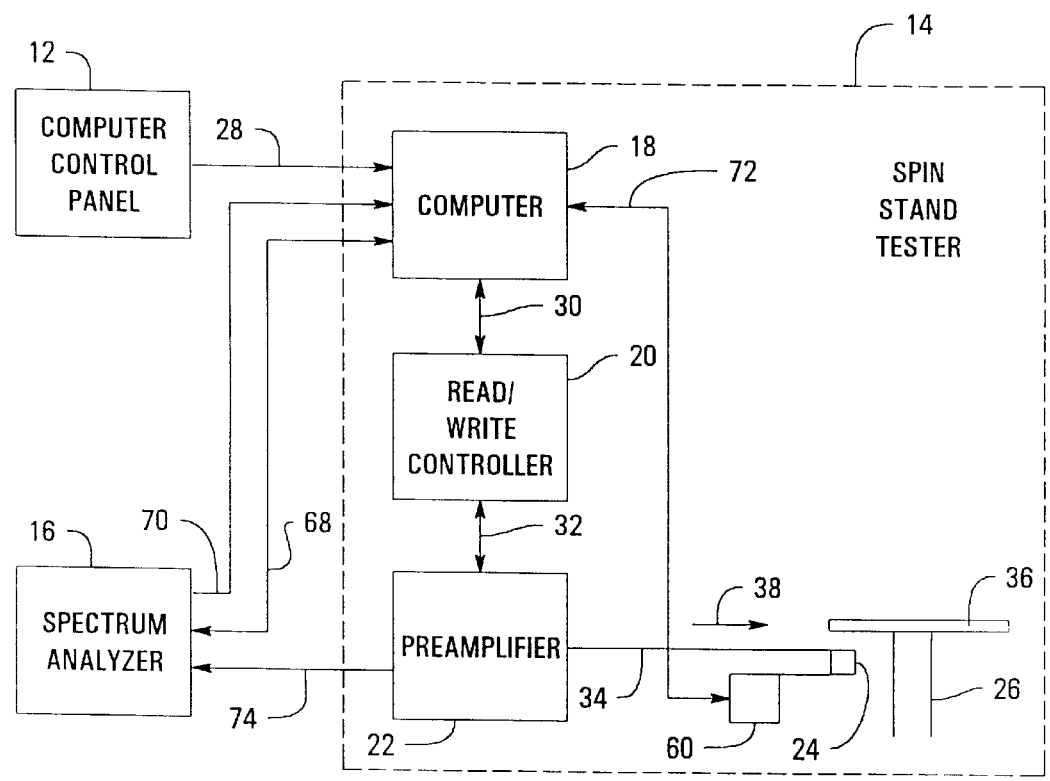
FIG. 1 is a schematic diagram of an erase band width measurement system according to an embodiment of the invention.

FIG. 1 illustrates an example of an erase band width measurement system 10 for use in measuring EBW in accordance with an embodiment of the invention. The erase band width measurement system 10 comprises a computer control panel 12, a spin stand tester 14, and a spectrum analyzer 16. The spin stand tester 14 comprises a computer 18, a read/write controller 20, a preamplifier 22, a read/write head assembly 24, a head positioner 60 coupled to the read/write head assembly 24, a spindle 26, and a disk 36 coupled to the spindle 26.

An operator (not shown in FIG. 1) controls the erase band width measurement system 10 by entering commands into the computer control panel 12, which communicates with the spin stand tester 14 through computer control signals 28. Responsive to the computer control signals 28, the computer 18 communicates with the read/write controller 20 through read/write control signals 30, communicates with the head positioner 60 through head positioner control signals 72, and communicates with the spectrum analyzer 16 through spectrum analyzer control signals 68. Responsive to the read/write control signals 30, the read/write controller 20 communicates with the preamplifier 22 through preamplifier control signals 32. Responsive to the preamplifier control signals 32, the preamplifier may source write current 38 to the read/write head assembly 24 through conductors 34, sense voltages from the read/write head assembly 24 across the conductors 34, or communicate with the spectrum analyzer 16 through an information signal 74. Responsive to the head positioner control signals 72, the head positioner 60 may move the read/write head assembly 24 radially with respect to the disk 36. Responsive to spectrum analyzer control signals 68, the spectrum analyzer may communicate data to the computer 18 through spectrum analyzer data signals 70.

To measure EBW, an operator uses the computer control panel 12 to initiate a program stored in computer 18. In alternative embodiments of the invention, the program may be stored in hardware, software, or firmware of the computer 18 or a peripheral (not shown in FIG. 1).

Figure 2:
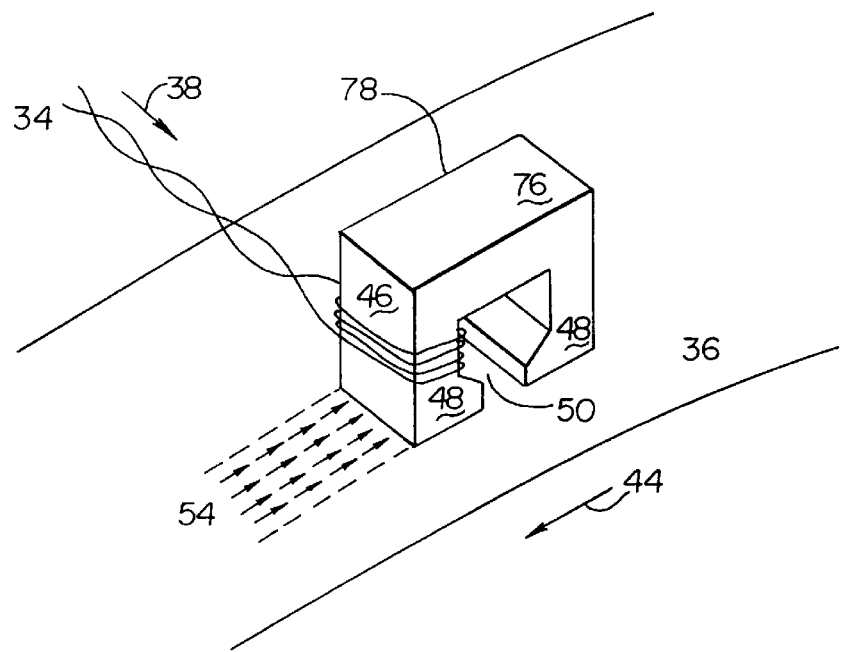
FIG. 2 is a diagram showing the DC-erasing of a test area on magnetic media according to an embodiment of the invention.

As illustrated in FIG. 2 and step 92 of FIG. 6, the program first causes a DC-erase to be performed such that all magnetic moments in the test area of the disk 36 are oriented in the same direction. To accomplish this, under program control the preamplifier 22 (not shown in FIG. 2) sources a constant write current 38 through a plurality of conductors 34 and into a write head 78, which forms a part of the read/write head assembly 24. The write head 78 includes a core 76 shaped to form poles 48 and a gap 50, and a coil 46 wrapped about the core 76 and coupled to the conductors 34. The constant write current 38 flowing through the coil induces a constant magnetic flux (not shown in FIG. 2) to form in the core 76 and fringe across the gap 50, orienting all magnetic moments under the gap 50 in the same direction and creating a track of DC-erased magnetic moments 54 as the disk 36 under test spins in the direction indicated by the arrow 44. The program then directs the head positioner 60 (not shown in FIG. 2) to radially reposition the write head 78 over adjacent areas of the disk 36, and the erase process is repeated until a sufficiently wide area of the disk 36 has been DC-erased.

Figure 3:
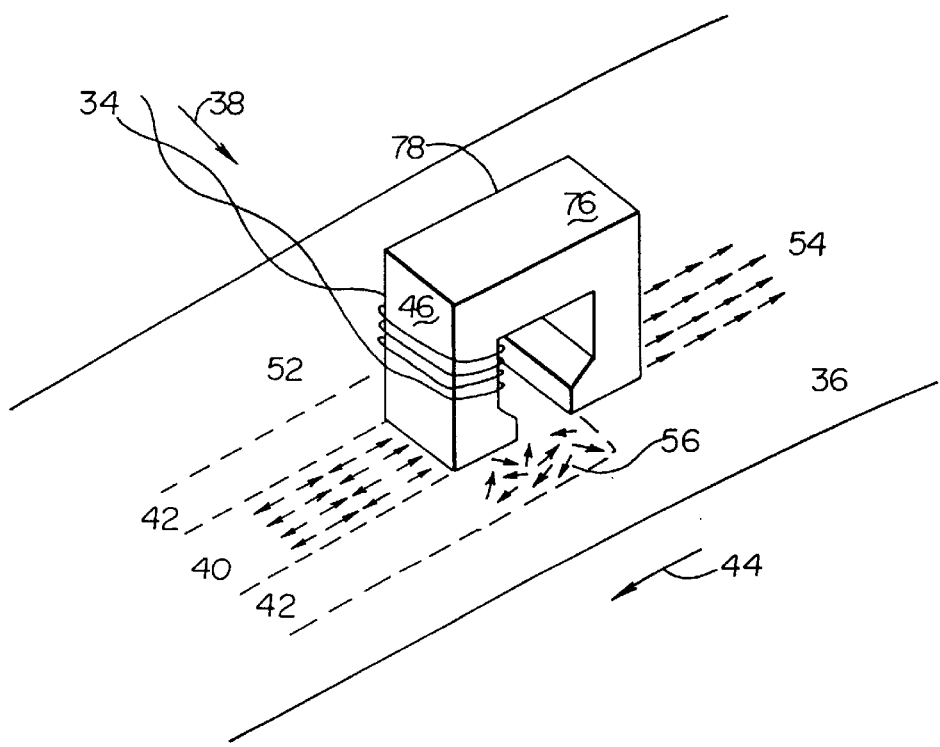
FIG. 3 is a diagram showing the writing of a test track and erase bands according to an embodiment of the invention.

Next, as illustrated in FIG. 3 and step 94 of FIG. 6, the program causes the writing of data onto a test track 40 and the formation of corresponding erase bands 42 over the DC-erased area of the disk 36. The process to accomplish this is very similar to the process for DC-erasing, except that the direction of the write current 38 is continually reversed. By continually reversing the direction of the write current 38 as the disk 36 spins in the direction indicated by the arrow 44, in preferred embodiments of the present invention a pattern of magnetic moments 52 with alternating orientations representing a periodic signal at a certain frequency is written onto the test track 40 at a certain linear density, overwriting the homogeneous orientation of DC-erased magnetic moments 54. At the same time that the test track 40 is being written with the square wave data, erase bands 42 are formed along the edges of the test track 40 due to edge effects from the write head 78. Within these erase bands 42, randomized magnetic moments 56 are formed. It should be noted that in alternate embodiments of the present invention, the test track data may be non-periodic.

Figure 4:
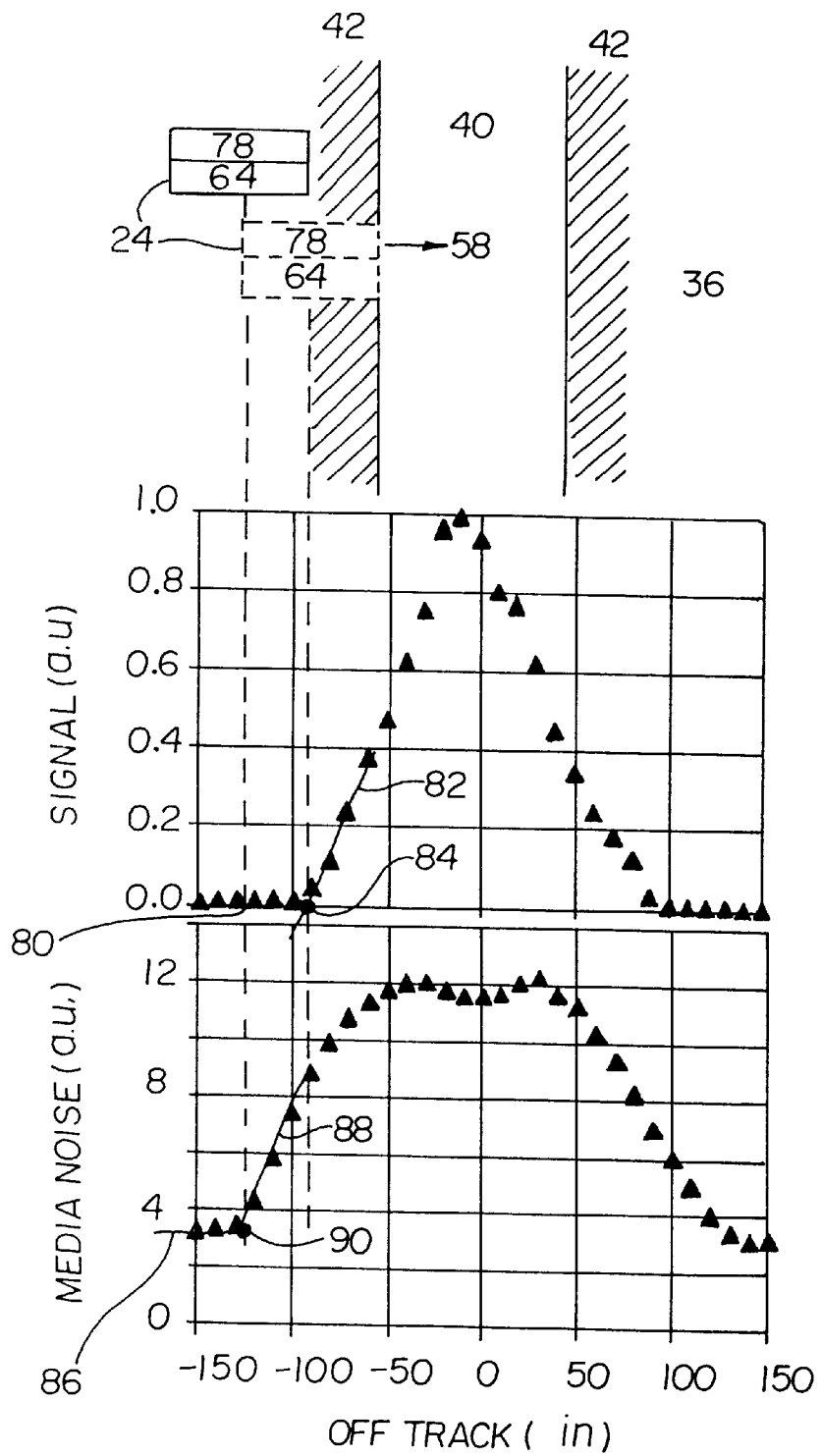
FIG. 4 is a diagram pictorially showing a track scan of the test track and erase bands according to an embodiment of the invention, including a corresponding graph of signal level as a function of the position of the read/write head assembly and a graph of media noise level as a function of the position of the read/write head assembly.

Once the test track 40 is completely written, a track scan is performed as illustrated in FIG. 4 and steps 96–108 of FIG. 6, wherein the read/write head assembly 24 is moved radially across the disk 36 in the direction of arrow 58 by the head positioner 60 (not shown in FIG. 4) under program control. In preferred embodiments of the invention, the read/write head assembly 24 includes a magneto-resistive (MR) read head 64 coupled to the write head 78. The MR read head 64 is comprised of a conductive element whose resistivity varies as a function of an applied magnetic field. In an MR head, a constant current is sourced through the element and a bias magnetic field is applied in an orientation approximately 45° from the direction of the current, and as the head is placed in close proximity with magnetized areas on the disk 36, the applied magnetic field from the magnetic moments on the disk 36 causes the resistance of the element, and hence the voltage across it, to change. If the net magnetic field (the bias magnetic field plus the applied magnetic field from the disk 36) is oriented parallel to the current, the resistance and voltage across the element increases. If the net magnetic field is oriented perpendicular to the current flow, the resistance and voltage across the element decreases. Thus, by sensing the voltage across the element, stored data in the form of oriented magnetic moments can be read. In alternative embodiments of the invention, the write head 78 also serves as the read head. In such embodiments, magnetic fields from the magnetic moments form in the core, and a voltage is induced in the coil 46. Again, by sensing the voltage across the coil, stored data in the form of oriented magnetic moments can be read.

Referring again to FIG. 1 and step 98 of FIG. 6, when the read/write head assembly 24, under program control, is positioned over an area on the disk 36 by the head positioner 60, the read/write head assembly 24 senses a voltage and communicates this voltage to the preamplifier 22 through conductors 34. The preamplifier 22 transforms the voltage reading into an information signal 74, and communicates the information signal 74 to the spectrum analyzer 16. The spectrum analyzer 16 performs a Fourier transform on the information signal 74 and computes and stores the resultant Fourier spectrum, as described in step 100 of FIG. 6. It should be noted that in alternative embodiments of the invention, the spectrum analyzer 16 may be any device, system, or analog filter that can perform a Fourier transform or a fast Fourier transform on the information signal 74 or derive all or part of the frequency spectrum from the information signal 74. The data points comprising the frequency spectrum are then communicated to the computer 18 through spectrum analyzer data signals 70.

As described in step 102 of FIG. 6, the amplitude of the fundamental frequency of the Fourier spectrum of the information signal 74 is saved. A program, for example, within the computer 18 is utilized to remove the peaks at the fundamental frequency and harmonic frequencies, as described in step 104 of FIG. 6. The resultant data points represent the noise power spectrum.

As described in step 106 of FIG. 6, a media noise calculation is then made by integrating the noise power spectrum over a predetermined frequency range, and this calculation is saved. Thus, for a given location of the read/write head assembly 24, two data points are collected, one representing the signal strength and one representing the media noise strength. Under program control, this process of reading an information signal 74 and manipulating it to derive a signal and media noise level data point is repeated as the read/write head assembly 24 incrementally traverses the erase bands 42 and test track 40. The collection of stored signal and media noise data points as a function of location is represented in FIG. 4, where the off-track location (in micro-inches) is referenced to the track center, and the signal and media noise levels are represented in arbitrary units (a.u.).

Referring to FIG. 4 and step 110 of FIG. 6, from the collection of stored signal data points a representation of the approximate location of the edge of the test track 40 can be provided. First, linear regression techniques are applied to those signal level data points whose signal level falls within a narrow amplitude range to derive a signal background line 80. Next, linear regression techniques are applied to those signal level data points whose signal level continually increases as the read/write head assembly 24 approaches the center of the test track 40 to derive a signal strength line 82. Finally, the intersection of the signal strength line 82 with the signal background line 80 can be computed and stored as a test track edge point 84, which represents the approximate edge of the test track 40.

Referring to FIG. 4 and step 112 of FIG. 6, from the collection of stored media noise data points a representation of the approximate location of the edge of the erase band 42 can be provided. First, linear regression techniques are applied to those media noise data points whose signal level falls within a narrow amplitude range to derive a media noise background line 86. Next, linear regression techniques are applied to those media noise data points whose signal level continually increases as the read/write head assembly 24 approaches a center of the test track 40 to derive a media noise strength line 88. Finally, the intersection of the media noise strength line 88 with the media noise background line 86 can be computed and stored as art erase band edge point 90, which represents the approximate edge of the erase band 42.

As described in step 114 of FIG. 6, the absolute value of the difference between the test track edge point 84 and the erase band edge point 90 corresponds to the EBW. In preferred embodiments of the invention, the derivation of test track edge point 84 and the erase band test point 90 are performed by the computer 18 under program control.

Figure 5:
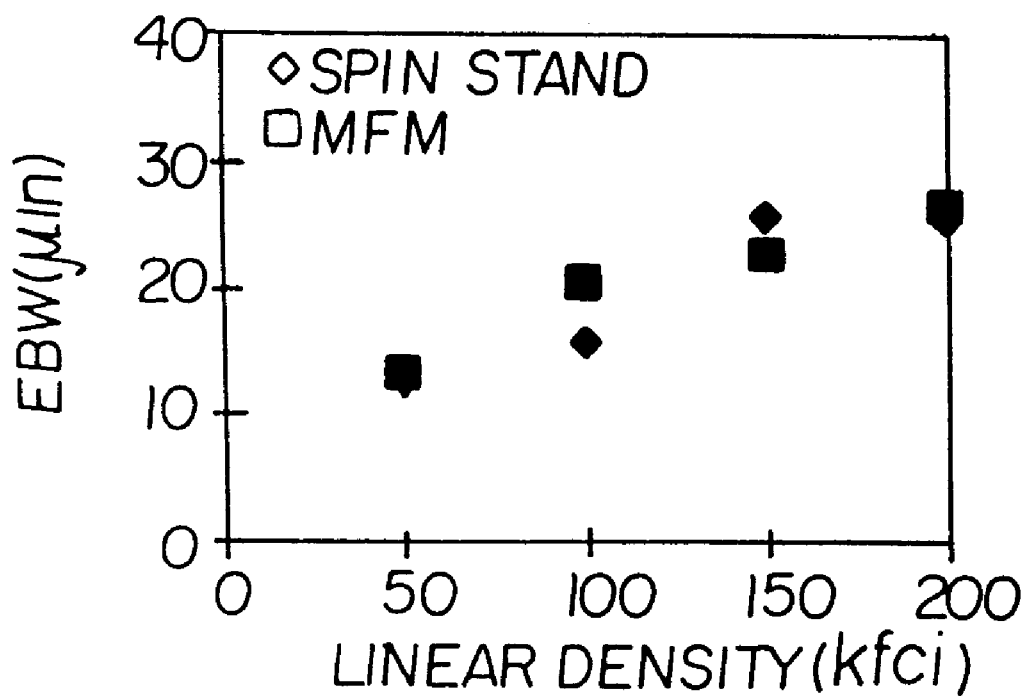
FIG. 5 is a diagram of EBW as a function of linear density as measured by an embodiment of the invention and a known MFM imaging method.

FIG. 5 is a comparison of EBW measurements using MFM imaging and an embodiment of the present invention utilizing an MR read head and write head combination, the write head having a top pole width of about 2.9 um and a coil with sixteen turns, demonstrating the correlation between the two methods and the expected increase in EBW with increasing linear density.

Therefore, according to the foregoing description, preferred embodiments of the present invention measure the width of an erase band without the need to first write reference tracks, without the need to write a plurality of tracks at different linear densities, and without the need for multiple spectrum analyzers.

The foregoing description of preferred embodiments of the invention has been presented for the purposes of illustration and description. It is not intended to be exhaustive or to limit the invention to the precise form disclosed. Many modifications and variations are possible in light of the above teaching. For example, although the drawings of embodiments of the invention disclose longitudinal recording, in other embodiments of the invention perpendicular recording may be employed. It is intended that the scope of the invention be limited not by this detailed description, but rather by the claims appended hereto.

What is claimed is:

1. A system for measuring a width of an erase band located adjacent to a test track on magnetic media, the test track containing a periodic signal at a certain frequency, the system comprising:

a read head for reading an information signal from the magnetic media as the read head incrementally traverses the erase band and test track; and means for obtaining signal level and media noise level data from the information signal as a function of read head position, and determining the erase band width based on the signal level and media noise level data.

2. A method for measuring a width of an erase band located adjacent to a test track on magnetic media, the test track containing a periodic signal at a certain frequency, the method comprising:

incrementally positioning a read head over the erase band and test track to traverse the erase band and test track in a direction perpendicular to a direction of travel of the magnetic media;

storing a signal level data point representing an amplitude of a fundamental frequency obtained from a Fourier spectrum of the periodic signal for each position of the read head as it incrementally traverses the erase band and test track;

storing a media noise level data point representing an integration of a noise power spectrum obtained from the Fourier spectrum of the periodic signal over a predetermined frequency range for each position of the read head as it incrementally traverses the erase band and test track;

locating an edge of the test track by determining from the stored signal level data points a point at which the amplitude of the stored signal level data points departs from an otherwise substantially constant level;

locating an edge of the erase band by determining from the stored media noise level data points a point at which the amplitude of the stored media noise level data points departs from an otherwise substantially constant level; and deriving a width for the erase band by computing an absolute value of a difference between positions of the edge of the test track and the edge of the erase band.

3. The method of claim 2, wherein the step of storing a signal level data point representing an amplitude of a fundamental frequency obtained from a Fourier spectrum of the periodic signal for each position of the read head as it incrementally traverses the erase band and test track further comprises the steps of:

reading an information signal from the magnetic media;

performing a Fourier transform on the information signal to generate frequency spectrum data points representing the Fourier spectrum of the information signal, the Fourier spectrum including peaks at the fundamental frequency and harmonics of the periodic signal; and storing a signal level data point representing an amplitude of the peak at the fundamental frequency at a given position of the read head.

4. The method of claim 3, wherein the step of storing a media noise level data point representing an integration of a noise power spectrum obtained from the Fourier spectrum of the periodic signal over a predetermined frequency range for each position of the read head as it incrementally traverses the erase band and test track further comprises the steps of:

modifying the frequency spectrum data points to eliminate the peaks at the fundamental frequency and harmonics of the periodic signal, the modified frequency spectrum data points comprising a noise power spectrum;

integrating the noise power spectrum over a predetermined frequency range to compute a media noise level; and storing a media noise data point representing the media noise level at a given position of the read head.

5. The method of claim 2, wherein the step of locating an edge of the test track by determining from the stored signal level data points a point at which the amplitude of the stored signal level data points departs from an otherwise substantially constant level further comprises the steps of:

applying linear regression techniques to those signal level data points whose signal level falls within a narrow amplitude range to derive a signal background line;

applying linear regression techniques to those signal level data points whose signal level continually increases as the read head position approaches a center of the test track to derive a signal strength line; and computing an intersection of the signal strength line with the signal background line and storing this intersection as a test track edge point representing an edge of the test track.

6. The method of claim 2, wherein the step of locating an edge of the erase band by determining from the stored media noise level data points a point at which the amplitude of the stored media noise level data points departs from an otherwise substantially constant level further comprises the steps of:

applying linear regression techniques to those media noise data points whose signal level falls within a narrow amplitude range to derive a media noise background line;

applying linear regression techniques to those media noise data points whose signal level continually increases as the read head position approaches a center of the test track to derive a media noise strength line; and computing an intersection of the media noise strength line with the media noise background line and storing this intersection as an erase band edge point representing the edge of the erase band.

7. The method of claim 2, wherein preceding the step of storing a signal level data point representing an amplitude of a fundamental frequency obtained from a Fourier spectrum of the periodic signal for each position of the read head as it incrementally traverses the erase band and test track, the method further includes the steps of:

writing a DC signal onto a plurality of adjacent tracks on the magnetic media to form a DC-erased area; and simultaneously writing a periodic signal at a specified frequency onto a test track and writing erase bands adjacent to the test track over the DC-erased area.

8. The method of claim 7, wherein the step of storing a signal level data point representing an amplitude of a fundamental frequency obtained from a Fourier spectrum of the periodic signal for each position of the read head as it incrementally traverses the erase band and test track further comprises the steps of:

reading an information signal from the magnetic media;

performing a Fourier transform on the information signal to generate frequency spectrum data points representing the Fourier spectrum of the information signal, the Fourier spectrum including peaks at the fundamental frequency and harmonics of the periodic signal; and storing a signal level data point representing an amplitude of the peak at the fundamental frequency at a given position of the read head.

9. The method of claim 7, wherein the step of storing a media noise level data point representing an integration of a noise power spectrum obtained from the Fourier spectrum of the periodic signal over a predetermined frequency range for each position of the read head as it incrementally traverses the erase band and test track further comprises the steps of:

modifying the frequency spectrum data points to eliminate the peaks at the fundamental frequency and harmonics of the periodic signal, the modified frequency spectrum data points comprising a noise power spectrum;

integrating the noise power spectrum over a predetermined frequency range to compute a media noise level; and storing a media noise data point representing the media noise level at a given position of the read head.

10. The method of claim 7, wherein the step of locating an edge of the test track by determining from the stored signal level data points a point at which the amplitude of the stored signal level data points departs from an otherwise substantially constant level further comprises the steps of:

applying linear regression techniques to those signal level data points whose signal level falls within a narrow amplitude range to derive a signal background line;

applying linear regression techniques to those signal level data points whose signal level continually increases as the read head position approaches a center of the test track to derive a signal strength line; and computing an intersection of the signal strength line with the signal background line and storing this intersection as a test track edge point representing an edge of the test track.

11. The method of claim 7, wherein the step of locating an edge of the erase band by determining from the stored media noise level data points a point at which the amplitude of the stored media noise level data points departs from an otherwise substantially constant level further comprises the steps of:

applying linear regression techniques to those media noise data points whose signal level falls within a narrow amplitude range to derive a media noise background line;

applying linear regression techniques to those media noise data points whose signal level continually increases as the read head position approaches a center of the test track to derive a media noise strength line; and computing an intersection of the media noise strength line with the media noise background line and storing this intersection as an erase band edge point representing the edge of the erase band.

12. A system for measuring a width of an erase band located adjacent to a test track on magnetic media, the test track containing a periodic signal at a certain frequency, the system comprising:

a read head for incrementally traversing the erase band and test track and for reading an information signal from the magnetic media at each incremental position of the read head;

a Fourier transform device responsive to the information signal from the read head for performing a Fourier transform on the information signal and generating a plurality of Fourier spectrum data points for each position of the read head as it incrementally traverses the erase band and test track; and a computing device in communication with the Fourier transform device for storing Fourier spectrum data points from the Fourier transform device, storing a signal level data point representing an amplitude of a fundamental frequency obtained from the Fourier spectrum data points for each position of the read head as it incrementally traverses; the erase band and test track, and storing a media noise level data point representing an integration of a noise power spectrum obtained from the Fourier spectrum data points for each position of the read head as it incrementally traverses the erase band and test track;

wherein an edge of the test track is located by determining from the stored signal level data points a point at which the amplitude of the stored signal level data points departs from an otherwise substantially constant level;

wherein an edge of the erase band is located by determining from the stored media noise level data points a point at which the amplitude of the stored media noise level data points departs from an otherwise substantially constant level; and wherein a width for the erase band is derived by computing an absolute value of a difference between positions of the edge of the test track and the edge of the erase band.

13. The system of claim 12:

wherein the computing device locates the edge of the test track by determining from the stored signal level data points the point at which the amplitude of the stored signal level data points departs from an otherwise substantially constant level;

wherein the computing device locates the edge of the erase band by determining from the stored media noise level data points the point at which the amplitude of the stored media noise level data points departs from an otherwise substantially constant level; and wherein the computing device derives the width for the erase band by computing the absolute value of the difference between positions of the edge of the test track and the edge of the erase band.

14. The system of claim 12, wherein the read head comprises a magneto-resistive (MR) read head.

15. The system of claim 12, further including a write head coupled to the read head for DC-erasing a test area of the magnetic media and for writing a periodic signal at a specified frequency on a test track and erase bands adjacent to the test track prior to the read head traversing the test track and erase band and reading the information signal from the magnetic media.

* * * * *